United States Patent
Lee et al.

(10) Patent No.: US 11,727,965 B2
(45) Date of Patent: Aug. 15, 2023

(54) NONVOLATILE MEMORY DEVICE, OPERATING METHOD OF NONVOLATILE MEMORY DEVICE, AND ELECTRONIC DEVICE INCLUDING NONVOLATILE MEMORY DEVICE

(71) Applicant: Samsung Electronics Co., Ltd., Suwon-si (KR)

(72) Inventors: Eunji Lee, Seongnam-si (KR); Suk-Soo Pyo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/507,216

(22) Filed: Oct. 21, 2021

(65) Prior Publication Data
US 2022/0277778 A1 Sep. 1, 2022

(30) Foreign Application Priority Data
Feb. 26, 2021 (KR) .......................... 10-2021-0026219

(51) Int. Cl.
*G11C 8/08* (2006.01)
*G11C 7/10* (2006.01)

(52) U.S. Cl.
CPC ............ *G11C 7/1039* (2013.01); *G11C 7/109* (2013.01); *G11C 7/1048* (2013.01); *G11C 7/1063* (2013.01); *G11C 7/1066* (2013.01); *G11C 7/1093* (2013.01); *G11C 8/08* (2013.01)

(58) Field of Classification Search
CPC ... G11C 7/1039; G11C 7/1048; G11C 7/1063; G11C 7/1066; G11C 7/109; G11C 7/1093; G11C 8/08; G11C 8/10; G11C 7/222; G11C 16/30; G11C 5/147; G11C 7/1051; G11C 7/1078; G11C 16/08; G11C 16/10; G11C 16/26; G11C 13/0028; G11C 11/2257; Y02D 10/00
See application file for complete search history.

(56) References Cited

U.S. PATENT DOCUMENTS

| | | | |
|---|---|---|---|
| 8,711,646 B2 | 4/2014 | Ong | |
| 8,730,744 B2 | 5/2014 | Kawakubo | |
| 9,076,512 B2 | 7/2015 | Kim | |
| 2003/0184549 A1* | 10/2003 | Kim | ...................... G06F 3/1415 345/503 |

(Continued)

FOREIGN PATENT DOCUMENTS

| | | |
|---|---|---|
| JP | 5257598 B2 | 8/2013 |
| JP | 5737003 B2 | 6/2015 |

(Continued)

*Primary Examiner* — Jay W. Radke
(74) *Attorney, Agent, or Firm* — Harness, Dickey & Pierce, P.L.C.

(57) ABSTRACT

A nonvolatile memory device including a memory cell array including a plurality of nonvolatile memory cells and a row decoder connected with the memory cell array through wordlines may be provided. The row decoder may be configured to precharge a first wordline corresponding to a first row address from among the wordlines, in response to receiving the first row address together with a first command, and maintain a precharge state of the first wordline, in response to receiving a second row address being identical to the first row address together with a second command following the first command.

17 Claims, 15 Drawing Sheets

(56) References Cited

U.S. PATENT DOCUMENTS

| | | | |
|---|---|---|---|
| 2010/0226195 A1* | 9/2010 | Lue | H01L 29/792 257/E21.602 |
| 2012/0137058 A1* | 5/2012 | Hanzawa | G11C 13/0097 711/E12.008 |
| 2014/0254270 A1* | 9/2014 | Maejima | G11C 16/08 365/185.11 |
| 2016/0188210 A1* | 6/2016 | Tanzawa | G06F 3/068 365/230.01 |
| 2020/0027505 A1 | 1/2020 | Lee et al. | |
| 2020/0090729 A1 | 3/2020 | Son et al. | |
| 2020/0411100 A1* | 12/2020 | Kamae | G06F 3/064 |

FOREIGN PATENT DOCUMENTS

| | | | |
|---|---|---|---|
| KR | 10-2001-0045945 A | 6/2001 | |
| KR | 10-2013-0116705 A | 10/2013 | |
| KR | 10-2020-0009460 A | 1/2020 | |
| KR | 10-2066724 B1 | 1/2020 | |
| WO | WO-2007149322 A2 * | 12/2007 | G06T 3/005 |

* cited by examiner

NONVOLATILE MEMORY DEVICE, OPERATING METHOD OF NONVOLATILE MEMORY DEVICE, AND ELECTRONIC DEVICE INCLUDING NONVOLATILE MEMORY DEVICE

CROSS-REFERENCE TO RELATED APPLICATIONS

This application claims priority under 35 U.S.C. § 119 to Korean Patent Application No. 10-2021-0026219 filed on Feb. 26, 2021, in the Korean Intellectual Property Office, the disclosure of which is incorporated by reference herein in their entireties.

BACKGROUND

Some example embodiments of the present disclosure described herein relate to semiconductor devices, and more particularly, relate to nonvolatile memory devices with an improved operating speed and reduced power consumption, operating methods of the nonvolatile memory devices, and/or electronic devices including the nonvolatile memory devices.

A nonvolatile memory device may be implemented in various types of memory devices such as a phase-change memory device, a ferroelectric memory device, a magnetic memory device, and a resistive memory device. The nonvolatile memory device may support a random access, and thus, may be utilized in various fields requiring a random access and a nonvolatile characteristic.

One of main characteristics that are required by an electronic device including the nonvolatile memory device is lower power consumption. Accordingly, a nonvolatile memory device that may operate at a low power may also be required.

SUMMARY

Some example embodiments of the present disclosure provide nonvolatile memory devices with an improved operating speed and reduced power consumption, operating methods of the nonvolatile memory devices, and electronic devices including the nonvolatile memory devices.

According to an example embodiment, a nonvolatile memory device includes a memory cell array including a plurality of nonvolatile memory cells, and a row decoder connected with the memory cell array through wordlines. In response to receiving a first row address together with a first command, the row decoder is configured to precharge a first wordline corresponding to the first row address from among the wordlines. In response to receiving a second row address identical to the first row address together with a second command following the first command, the row decoder is configured to maintain a precharge state of the first wordline.

According to an example embodiment, an operating method of a nonvolatile memory device includes receiving, at the nonvolatile memory device, a command and a row address, discharging a previous wordline corresponding to a previous wordline row address and precharging a wordline corresponding to the row address, in response to the row address being different from the previous row address, and maintaining a precharge state of the previous wordline in response to the row address being identical to the previous row address.

According to an example embodiment, an electronic device includes a central processing unit configured to generate image information, a graphic processing device configured to generate image data based on the image information received from the central processing unit, a frame buffer configured to store the image data received from the graphic processing device, and a display device configured to display the image data received from the frame buffer. The frame buffer includes a nonvolatile memory device, which includes a memory cell array including a plurality of nonvolatile memory cells and a row decoder connected with the memory cell array through wordlines. In response to receiving a row address from the graphic processing device being different from a previous row address previously received from the graphic processing device, the row decoder is configured to discharge the previous wordline corresponding to the previous wordline and precharge a wordline corresponding to the row address. In response to the row address being identical to the previous row address, the row decoder is configured to maintain a precharge state of the previous wordline.

BRIEF DESCRIPTION OF THE FIGURES

The above and other objects and features of the present disclosure will become apparent by describing in detail some example embodiments thereof with reference to the accompanying drawings.

DETAILED DESCRIPTION

Below, some example embodiments of the present disclosure may be described in detail and clearly to such an extent that one skilled in the art easily may carry out the present disclosure.

Figure 1:
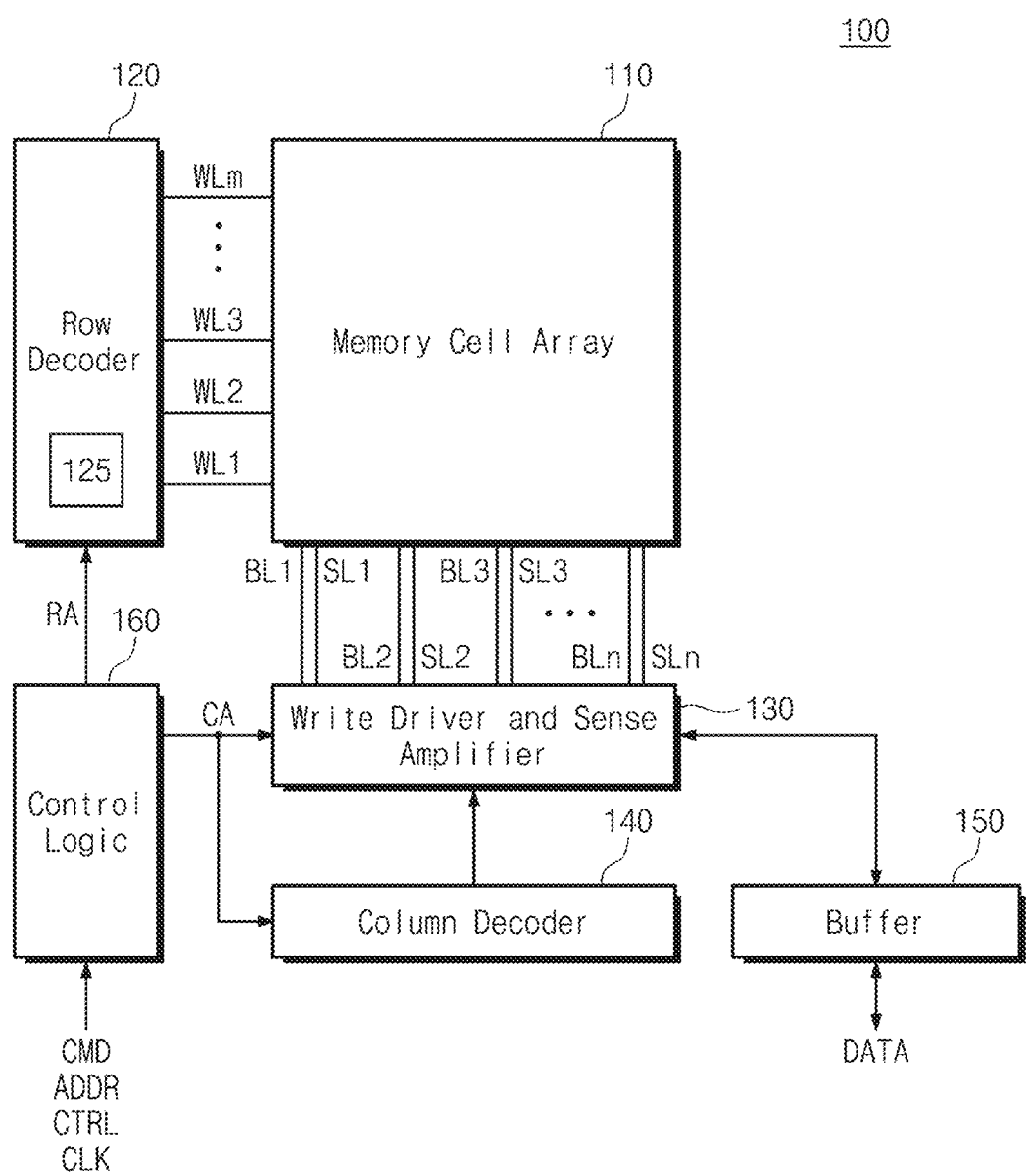
FIG. 1 illustrates a nonvolatile memory device according to an example embodiment of the present disclosure.

FIG. 1 illustrates a nonvolatile memory device 100 according to an example embodiment of the present disclosure. Referring to FIG. 1, the nonvolatile memory device 100 may include a memory cell array 110, a row decoder 120, a write driver and sense amplifier 130, a column decoder 140, a buffer 150, and control logic 160.

The memory cell array 110, the row decoder 120, the write driver and sense amplifier 130, the column decoder 140, the buffer 150, and the control logic 160 may be implemented with hardware distinguished from each other. The memory cell array 110, the row decoder 120, the write driver and sense amplifier 130, the column decoder 140, the buffer 150, and the control logic 160 may be called in combination with various terms such as a circuit, a block, and a unit.

The memory cell array 110 may include nonvolatile memory cells arranged in rows and columns. For example, the nonvolatile memory cells may include phase-change memory cells, ferroelectric memory cells, magnetic memory cells, or resistive memory cells. Nonvolatile memory cells in the rows may be connected with first to m-th wordlines WL1 to WLm. Nonvolatile memory cells in the columns may be connected with first to n-th bitlines BL1 to BLn and first to n-th source lines SL1 to SLn.

The row decoder 120 may be connected with the nonvolatile memory cells in the rows of the memory cell array 110 through the first to m-th wordlines WL1 to WLm. The row decoder 120 may receive a row address RA from the control logic 160. Based on the row address RA, the row decoder 120 may select one of the first to m-th wordlines WL1 to WLm and may not select the remaining wordlines thereof.

The row decoder 120 may apply a selection wordline voltage to the selected wordline and a non-selection wordline voltage to the unselected wordlines (or may float the unselected wordlines). For example, a level of the selection wordline voltage and a level of the non-selection wordline voltage may vary depending on whether any of a first write operation (or a set operation), a second write operation (or a reset operation), or a read operation is performed.

The write driver and sense amplifier 130 may be connected with the nonvolatile memory cells in the columns of the memory cell array 110 through the first to n-th bitlines BL1 to BLn and the first to n-th source lines SL1 to SLn. For example, one bitline and one source line may be connected with one column of nonvolatile memory cells.

The write driver and sense amplifier 130 may include write driver circuits and sense amplifier circuits, the write driver circuits may respectively correspond to the first to n-th bitlines BL1 to BLn and may respectively correspond to the first to n-th source lines SL1 to SLn, and the sense amplifier circuits may respectively correspond to the first to n-th bitlines BL1 to BLn and may respectively correspond to the first to n-th source lines SL1 to SLn. The write driver and sense amplifier 130 may receive a column address CA from the control logic 160.

In a write operation, based on the column address CA, some write driver circuits of the write driver circuits may be activated, and the remaining write driver circuits and the sense amplifier circuits may be deactivated. Each of the activated write driver circuits may apply voltages for the write operation to the corresponding source line and the corresponding bitline. Each of the deactivated write driver circuits may apply voltages for inhibiting the write operation to the corresponding source line and/or the corresponding bitline or may float the corresponding source line and/or the corresponding bitline.

In a read operation, based on the column address CA, some sense amplifier circuits of the sense amplifier circuits may be activated, and the remaining sense amplifier circuits and the write driver circuits may be deactivated. Each of the activated sense amplifier circuits may apply voltages for the read operation to the corresponding source line and the corresponding bitline. Each of the deactivated sense amplifier circuits may apply voltages for inhibiting the read operation to the corresponding source line and/or the corresponding bitline or may float the corresponding source line and/or the corresponding bitline.

An example in which the write driver and sense amplifier 130 is connected with the memory cell array 110 through the first to n-th bitlines BL1 to BLn and the first to n-th source lines SL1 to SLn is illustrated. However, the first to n-th bitlines BL1 to BLn and the first to n-th source lines SL1 to SLn may be omitted. That is, in the memory cell array 110, one column of nonvolatile memory cells may be connected with one line (e.g., a bitline or a source line).

The column decoder 140 may provide switching between the write driver and sense amplifier 130 and the buffer 150 and/or switching between the write driver and sense amplifier 130 and the memory cell array 110. The column decoder 140 may receive the column address CA from the control logic 160. Based on the column address CA, the column decoder 140 may perform switching such that activated write driver circuits or activated sense amplifier circuits are electrically connected with the buffer 150. Simultaneously/alternatively, based on the column address CA, the column decoder 140 may perform switching such that the activated write driver circuits or the activated sense amplifier circuits are electrically connected with the corresponding bitlines and the corresponding source lines.

The buffer 150 may exchange data with an external device and may exchange data with the write driver and sense amplifier 130. The buffer 150 may transfer data received from the external device to activated write driver circuits of the write driver and sense amplifier 130. The buffer 150 may transfer data sensed by activated sense amplifier circuits to the external device.

The control logic 160 may receive a command CMD, an address ADDR, a control signal CTRL, and a clock signal CLK from the external device. The command CMD and the address ADDR may be received in an order of the command CMD and the address ADDR or in an order of the address ADDR and the command CMD. In some example embodiments, the command CMD and the address ADDR may be received at the same time.

The command CMD may include a write command or a read command. The write command may cause one of a first write operation (or a set operation), a second write operation (or a reset operation) or both. In response to the command CMD, the control logic 160 may control the row decoder 120, the write driver and sense amplifier 130, the column decoder 140, and the buffer 150 such that the write operation or the read operation is performed. The write operation may include one of the first write operation (or the set operation), the second write operation (or the reset operation) or both.

The address ADDR may include the row address RA and the column address CA. The control logic 160 may transfer the row address RA to the row decoder 120 and may transfer the column address CA to the write driver and sense amplifier 130 and the column decoder 140.

The control signal CTRL may include various signals that are used to control the nonvolatile memory device 100. For example, some of the signals included in the control signal CTRL may be bidirectional signals and may be used to notify a state of the nonvolatile memory device 100 to the external device.

The clock signal CLK may be used for synchronization between an operation of the nonvolatile memory device 100 and an operation of the external device. The nonvolatile memory device 100 may interact with the external device in synchronization with the clock signal CLK. For example, the nonvolatile memory device 100 may exchange the command CMD, the address ADDR, the control signal CTRL, or data "DATA" with the external device in synchronization with the clock signal CLK.

For example, the control logic 160 may multiply a frequency of the clock signal CLK to generate an internal clock signal of a high frequency. The control logic 160 may control the row decoder 120, the write driver and sense amplifier 130, the column decoder 140, and the buffer 150 based on the internal clock signal. For example, the control logic 160 may control operation timings, switching timings, etc. of the row decoder 120, the write driver and sense amplifier 130, the column decoder 140, and the buffer 150 based on the internal clock signal.

The row decoder 120 may include a precharge determining circuit 125. The precharge determining circuit 125 may determine whether a precharged wordline is to be discharged and a discharged wordline is to be precharged, based on the row address RA. For example, that a wordline is to be precharged may indicate the corresponding wordline is selected for the first write operation, the second write operation, or the read operation. That a wordline is to be discharged may mean that the selection of the wordline where the first write operation, the second write operation, or the read operation is performed is cancelled.

The precharge determining circuit 125 may control the row decoder 120 such that discharging and precharging are selectively performed, thus reducing power consumption of the nonvolatile memory device 100 and making an operating speed higher.

Figure 2:
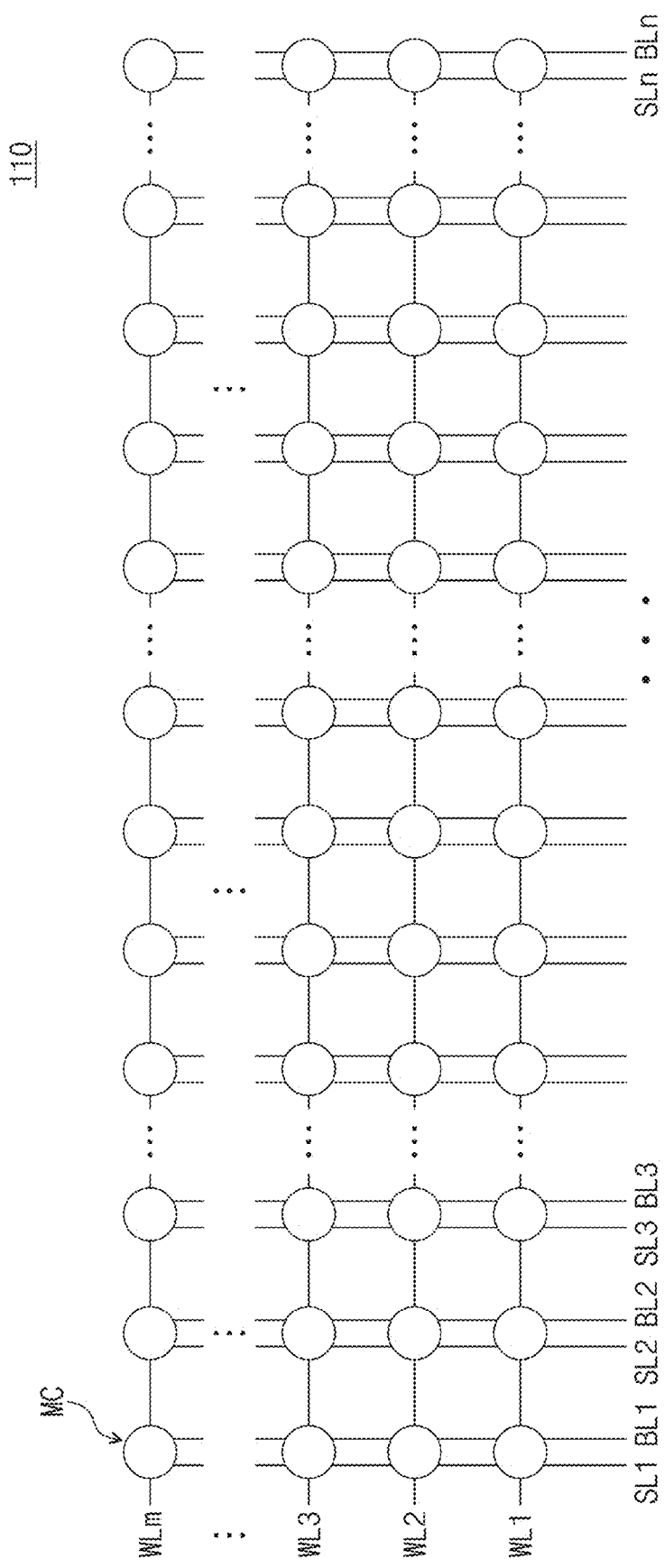
FIG. 2 illustrates an example of nonvolatile memory cells of a memory cell array according to an example embodiment of the present disclosure.

FIG. 2 illustrates an example of nonvolatile memory cells MC of the memory cell array 110 according to an example embodiment of the present disclosure. Referring to FIGS. 1 and 2, the nonvolatile memory cells MC in the rows may be connected with the first to m-th wordlines WL1 to WLm. Each of columns of the nonvolatile memory cells MC may correspond to one of the first to n-th bitlines BL1 to BLn and one of the first to n-th source lines SL1 to SLn.

Figure 3:
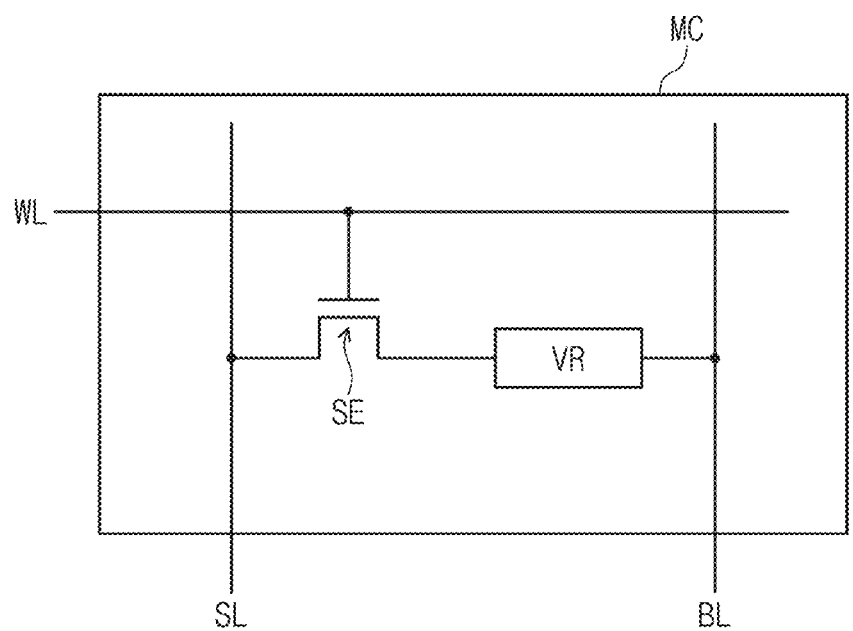
FIG. 3 illustrates an example of a nonvolatile memory cell.

FIG. 3 illustrates an example of the nonvolatile memory cell MC. Referring to FIGS. 1, 2, and 3, the nonvolatile memory cell MC may include a selection element SE and a variable resistance element VR. The selection element SE may include a transistor including a gate connected with a wordline WL, a first terminal connected with a source line SL, and a second terminal connected with the variable resistance element VR.

The variable resistance element VR may be connected between the selection element SE and a bitline BL. A resistance value of the variable resistance element VR may be adjusted as a voltage or current in a specific range(s) is formed across the variable resistance element VR (e.g., the first write operation or the second write operation). The resistance value of the variable resistance element VR may be maintained (or e.g., read) as a voltage or current in a specific range(s) is formed across the variable resistance element VR (e.g., the read operation). For example, the variable resistance element VR may include a phase change element, a magnetic element, a ferroelectric element, or a resistive element.

For example, the selection element SE may be replaced with a diode. A first terminal of the diode may be connected with the wordline WL, and a second terminal of the diode may be connected with the bitline BL through the variable resistance element VR. That is, the source line SL may be omitted. For another example, the selection element SE may be omitted. A first terminal of the variable resistance element VR may be connected with the wordline WL, and a second terminal of the variable resistance element VR may be connected with the bitline BL. That is, the source line SL may be omitted.

Figure 4:
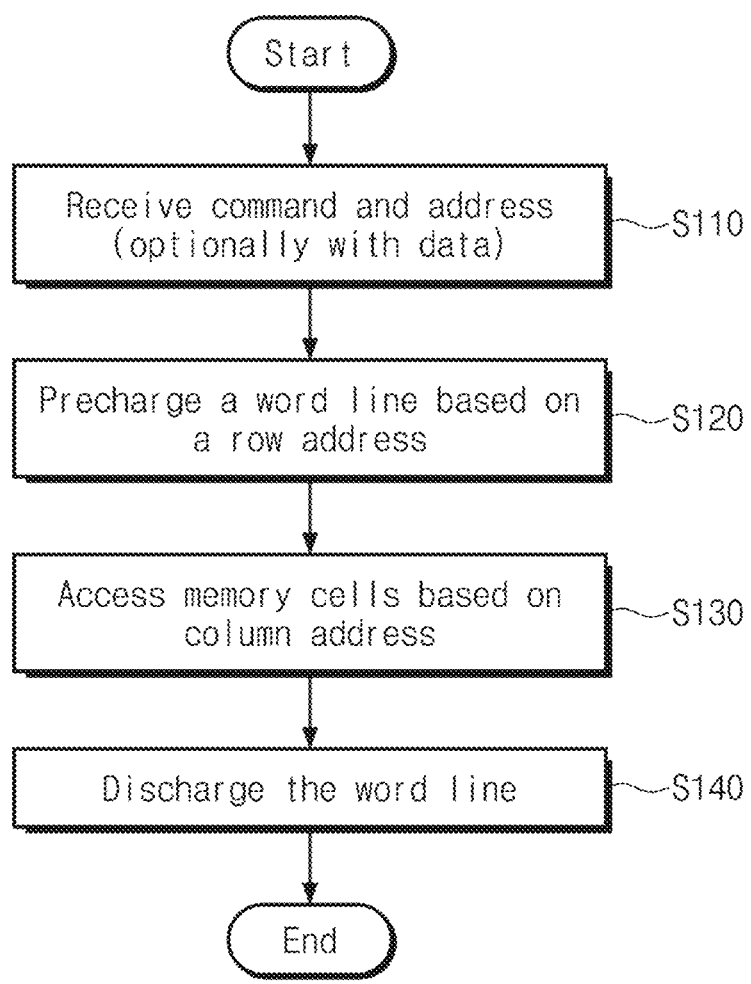
FIG. 4 illustrates an operating method according to a first example embodiment of a nonvolatile memory device.

FIG. 4 illustrates an operating method according to a first example embodiment of the nonvolatile memory device 100. Referring to FIGS. 1, 2, 3, and 4, in operation S110, the control logic 160 may receive the command CMD and the address ADDR. The control logic 160 may optionally receive data together. For example, when the command CMD is a read command, data may not be received. When the command CMD is a write command, data may be received together.

In operation S120, the row decoder 120 may precharge a wordline based on the row address RA. For example, the row decoder 120 may precharge a wordline selected by the row address RA. Precharging may include applying a voltage or current to the selected wordline such that the selection elements SE of the nonvolatile memory cells MC connected with the selected wordline are turned on.

In operation S130, the write driver and sense amplifier 130 may access the nonvolatile memory cells MC based on the column address CA. For example, the write driver and sense amplifier 130 may perform the first write operation (or the set operation), the second write operation (or the reset operation), or the read operation on the respective nonvolatile memory cells MC corresponding to the column address CA.

When the nonvolatile memory cells MC are completely accessed, in operation S140, the row decoder 120 may discharge (e.g., deactivate) the precharged (e.g., activated) wordline (or may cancel the selection of the selected wordline).

Figure 5:
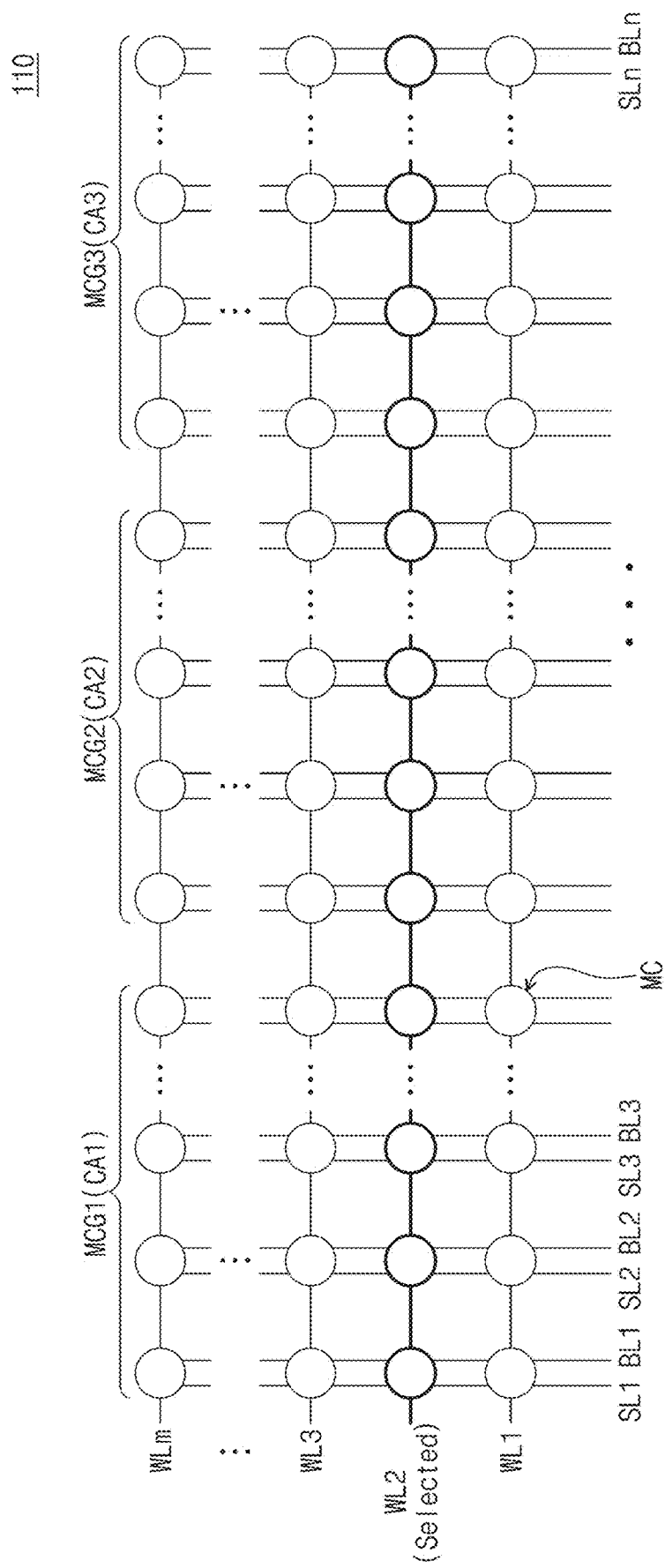
FIG. 5 illustrates an example in which nonvolatile memory cells of a memory cell array are accessed.

FIG. 5 illustrates an example in which the nonvolatile memory cells MC of the memory cell array 110 are accessed. Referring to FIGS. 1 and 5, the second wordline WL2 may be selected. The nonvolatile memory cells MC connected with the second wordline WL2 may be classified into a first memory cell group MCG1, a second memory cell group MCG2, and a third memory cell group MCG3.

A memory cell group may be a unit of memory cells that are accessed by one column address CA. For example, when the address ADDR includes a first column address CA1, the write driver and sense amplifier 130 may access the nonvolatile memory cells MC of the first memory cell group MCG1.

When the address ADDR includes a second column address CA2, the write driver and sense amplifier 130 may access the nonvolatile memory cells MC of the second memory cell group MCG2. When the address ADDR includes a third column address CA3, the write driver and sense amplifier 130 may access the nonvolatile memory cells MC of the third memory cell group MCG3.

Figure 6:
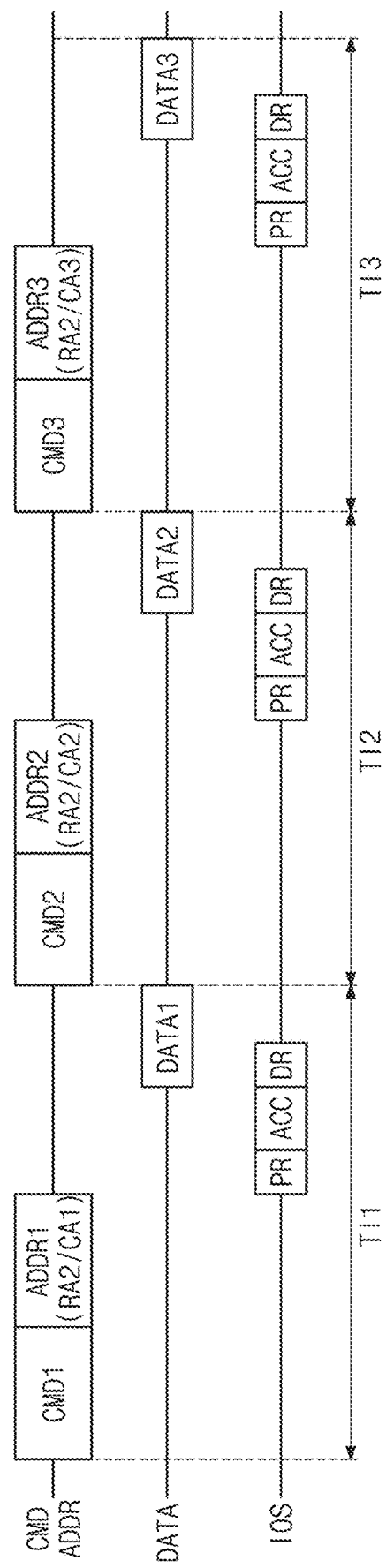
FIG. 6 illustrates an example of the process of accessing nonvolatile memory cells of FIG. 5 based on the method of FIG. 4.

FIG. 6 illustrates an example of the process of accessing the nonvolatile memory cells MC of FIG. 5 based on the method of FIG. 4. Referring to FIGS. 1, 4, 5, and 6, the command CMD and the address ADDR received by the control logic 160, data of the buffer 150 exchanged with the external device, and an internal operation IOS of the nonvolatile memory device 100 are illustrated. An example in which the command CMD and the address ADDR are sequentially received by the control logic 160 is illustrated. However, the address ADDR may be received prior to the command CMD, or the command CMD and the address ADDR may be received at the same time.

As a first command CMD1 and a first address ADDR1 are received, the nonvolatile memory device 100 may perform the internal operation IOS based on the first command CMD1 and the first address ADDR1. The first command CMD1 may include a write command or a read command, but it is assumed in FIG. 6 that the first command CMD1 is the read command.

The first address ADDR1 may include a second row address RA2 and the first column address CAL As illustrated in FIG. 5, the second row address RA2 may indicate the second wordline WL2. The first column address CA1 may indicate the first memory cell group MCG1.

The row decoder 120 may perform a precharge operation PR to select (or activate) the second wordline WL2. The write driver and sense amplifier 130 may perform an access operation ACC to access (e.g., read) the nonvolatile memory cells MC of the first memory cell group MCG1. As the access operation ACC is completed, the buffer 150 may output first data DATA1 read from the nonvolatile memory cells MC of the first memory cell group MCG1 to the external device.

As the access operation ACC is completed, the row decoder 120 may perform a discharge operation DR of the second wordline WL2 to cancel the selection of the second wordline WL2 (or to deactivate the second wordline WL2). The operation according to the first command CMD1 and the first address ADDR1 may be performed during a first time interval TI1.

For example, when the first command CMD1 is a write command, the first data DATA1 may be received from the external device following the first address ADDR1. After the first data DATA1 are completely received, the access operation ACC (e.g., the write operation) and the discharge operation DR may be performed.

As a second command CMD2 and a second address ADDR2 are received, the nonvolatile memory device 100 may perform the internal operation IOS based on the second command CMD2 and the second address ADDR2. It is assumed that the second command CMD2 may be the read command.

The second address ADDR2 may include the second row address RA2 and the second column address CA2. As illustrated in FIG. 5, the second row address RA2 may indicate the second wordline WL2. The second column address CA2 may indicate the second memory cell group MCG2.

The row decoder 120 may perform the precharge operation PR to select (or activate) the second wordline WL2. The write driver and sense amplifier 130 may perform the access operation ACC to access (e.g., read) the nonvolatile memory cells MC of the second memory cell group MCG2. As the access operation ACC is completed, the buffer 150 may output second data DATA2 read from the nonvolatile memory cells MC of the second memory cell group MCG2 to the external device.

As the access operation ACC is completed, the row decoder 120 may perform the discharge operation DR of the second wordline WL2 to cancel the selection of the second wordline WL2 (or to deactivate the second wordline WL2). The operation according to the second command CMD2 and the second address ADDR2 may be performed during a second time interval TI2.

For example, when the second command CMD2 is the write command, the second data DATA2 may be received from the external device following the second address ADDR2. After the second data DATA2 are completely received, the access operation ACC (e.g., the write operation) and the discharge operation DR may be performed.

As a third command CMD3 and a third address ADDR3 are received, the nonvolatile memory device 100 may perform the internal operation IOS based on the third command CMD3 and the third address ADDR3. It is assumed that the third command CMD3 may be the read command.

The third address ADDR3 may include the second row address RA2 and the third column address CA3. As illustrated in FIG. 5, the second row address RA2 may indicate the second wordline WL2. The third column address CA3 may indicate the third memory cell group MCG3.

The row decoder 120 may perform the precharge operation PR to select (or activate) the second wordline WL2. The write driver and sense amplifier 130 may perform the access operation ACC to access (e.g., read) the nonvolatile memory cells MC of the third memory cell group MCG3. As the access operation ACC is completed, the buffer 150 may output third data DATA3 read from the nonvolatile memory cells MC of the third memory cell group MCG3 to the external device.

As the access operation ACC is completed, the row decoder 120 may perform the discharge operation DR of the second wordline WL2 to cancel the selection of the second wordline WL2 (or to deactivate the second wordline WL2). The operation according to the third command CMD3 and the third address ADDR3 may be performed during a third time interval TI3.

For example, when the third command CMD3 is the write command, the third data DATA3 may be received from the external device following the third address ADDR3. After the third data DATA3 are completely received, the access operation ACC (e.g., the write operation) and the discharge operation DR may be performed.

An example in which the nonvolatile memory device 100 consecutively performs the read operations is illustrated in FIG. 6. However, the nonvolatile memory device 100 may consecutively perform the write operations depending on commands and may perform a combination of the read operation and the write operation depending on commands.

Figure 7:
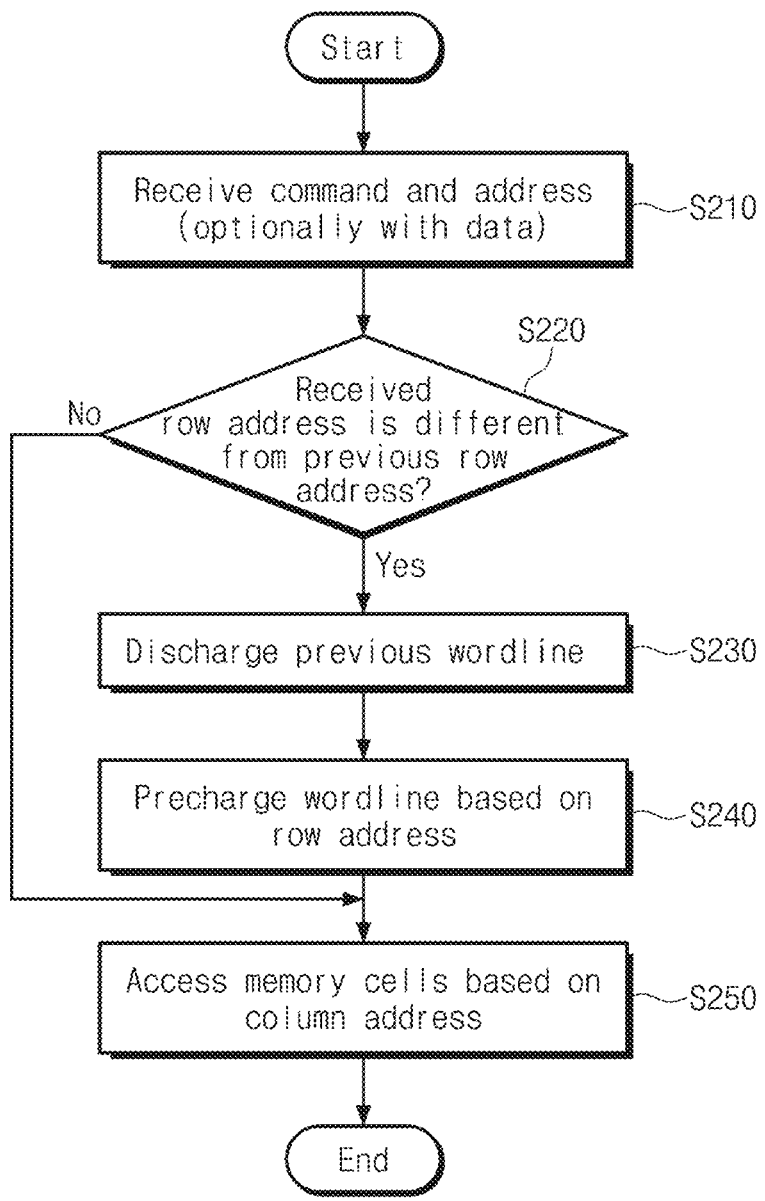
FIG. 7 illustrates an operating method according to a second example embodiment of a nonvolatile memory device.

FIG. 7 illustrates an operating method according to a second example embodiment of the nonvolatile memory device 100. Referring to FIGS. 1, 2, 3, and 7, in operation S210, the control logic 160 may receive the command CMD and the address ADDR. The control logic 160 may optionally receive data together. For example, when the command CMD is the read command, data may not be received. When the command CMD is the write command, data may be received together.

In operation S220, the row decoder 120 may determine whether the received row address RA is different from a previous row address (e.g., a row address received together with an immediately previous command). When the received row address RA is different from the previous row address, in operation S230, the row decoder 120 may discharge a wordline precharged by the previous row address. Afterwards, in operation S240, the row decoder 120 may precharge a wordline based on the received row address RA. In operation S250, the write driver and sense amplifier 130 may access nonvolatile memory cells based on the column address CA.

When it is determined in operation S220 that the received row address RA is not different from the previous row address, the row decoder 120 may not perform precharging and discharging. The row decoder 120 may maintain a precharge state of the wordline selected (or activated) by the previous row address. In operation S250, the write driver and sense amplifier 130 may access the nonvolatile memory cells MC based on the column address CA.

Comparing FIG. 7 with FIG. 4, in the example embodiment of FIG. 4, the row decoder 120 may receive the row address RA, may precharge a wordline corresponding to the row address RA, may access the nonvolatile memory cells MC, and may discharge the wordline corresponding to the row address RA. Afterwards, a new row address may be received for a new access.

In the example embodiment of FIG. 7, the row decoder 120 may not perform discharging after completing an access according to a previous row address. Only when a new row address RA is received and the new row address RA is different from the previous row address, discharging and precharging may be sequentially performed. Also, when the new row address RA is the same as the previous row address, the row decoder 120 may skip discharging and precharging.

Figure 8:
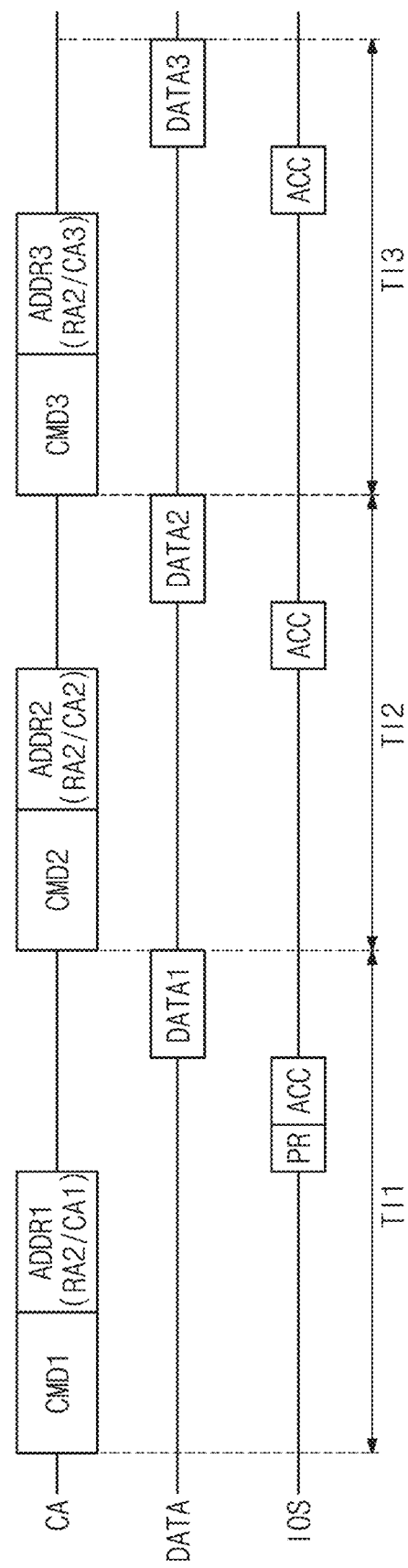
FIG. 8 illustrates an example of the process of accessing nonvolatile memory cells of FIG. 5 based on the method of FIG. 7.

FIG. 8 illustrates an example of the process of accessing the nonvolatile memory cells MC of FIG. 5 based on the method of FIG. 7. Referring to FIGS. 1, 5, 7, and 8, the command CMD and the address ADDR received by the control logic 160, data of the buffer 150 exchanged with the external device, and an internal operation IOS of the nonvolatile memory device 100 are illustrated. An example in which the command CMD and the address ADDR are sequentially received by the control logic 160 is illustrated. However, the address ADDR may be received prior to the command CMD, or the command CMD and the address ADDR may be received at the same time.

As the first command CMD1 and the first address ADDR1 are received, the nonvolatile memory device 100 may perform the internal operation IOS based on the first command CMD1 and the first address ADDR1. The first command CMD1 may include the write command or the read command, but it is assumed in FIG. 8 that the first command CMD1 is the read command.

The first address ADDR1 may include the second row address RA2 and the first column address CAL As illustrated in FIG. 5, the second row address RA2 may indicate the second wordline WL2. The first column address CA1 may indicate the first memory cell group MCG1. For example, the second row address RA2 may be different from a previous row address.

The row decoder 120 may perform the precharge operation PR to select (or activate) the second wordline WL2. The write driver and sense amplifier 130 may perform an access operation ACC to access (e.g., read) the nonvolatile memory cells MC of the first memory cell group MCG1. As the access operation ACC is completed, the buffer 150 may output first data DATA1 read from the nonvolatile memory cells MC of the first memory cell group MCG1 to the external device.

The operation according to the first command CMD1 and the first address ADDR1 may be terminated without the discharge operation DR (refer to FIG. 6). The operation according to the first command CMD1 and the first address ADDR1 may be performed during the first time interval TI1.

For example, when the first command CMD1 is a write command, the first data DATA1 may be received from the external device following the first address ADDR1. After the first data DATA1 are completely received, the access operation ACC (e.g., the write operation) may be performed.

As the second command CMD2 and the second address ADDR2 are received, the nonvolatile memory device 100 may perform the internal operation IOS based on the second command CMD2 and the second address ADDR2. It is assumed that the second command CMD2 may be the read command.

The second address ADDR2 may include the second row address RA2 and the second column address CA2. As illustrated in FIG. 5, the second row address RA2 may indicate the second wordline WL2. The second column address CA2 may indicate the second memory cell group MCG2.

Because the second row address RA2 of the second address ADDR2 is the same as a previous row address (e.g., the second row address RA2), the row decoder 120 may skip the precharge operation PR. The write driver and sense amplifier 130 may perform the access operation ACC to access (e.g., read) the nonvolatile memory cells MC of the second memory cell group MCG2. As the access operation ACC is completed, the buffer 150 may output second data DATA2 read from the nonvolatile memory cells MC of the second memory cell group MCG2 to the external device.

The operation according to the second command CMD2 and the second address ADDR2 may be terminated without the discharge operation DR (refer to FIG. 6). The operation according to the second command CMD2 and the second address ADDR2 may be performed during the second time interval TI2.

For example, when the second command CMD2 is the write command, the second data DATA2 may be received from the external device following the second address ADDR2. After the second data DATA2 are completely received, the access operation ACC (e.g., the write operation) may be performed.

As the third command CMD3 and the third address ADDR3 are received, the nonvolatile memory device 100 may perform the internal operation IOS based on the third command CMD3 and the third address ADDR3. It is assumed that the third command CMD3 may be the read command.

The third address ADDR3 may include the second row address RA2 and the third column address CA3. As illustrated in FIG. 5, the second row address RA2 may indicate the second wordline WL2. The third column address CA3 may indicate the third memory cell group MCG3.

Because the second row address RA2 of the third address ADDR3 is the same as a previous row address (e.g., the second row address RA2), the row decoder 120 may skip the precharge operation PR. The write driver and sense amplifier 130 may perform the access operation ACC to access (e.g., read) the nonvolatile memory cells MC of the third memory cell group MCG3. As the access operation ACC is completed, the buffer 150 may output third data DATA3 read from the nonvolatile memory cells MC of the third memory cell group MCG3 to the external device.

The operation according to the third command CMD3 and the third address ADDR3 may be terminated without the discharge operation DR (refer to FIG. 6). The operation according to the third command CMD3 and the third address ADDR3 may be performed during the third time interval TI3.

For example, when the third command CMD3 is the write command, the third data DATA3 may be received from the external device following the third address ADDR3. After the third data DATA3 are completely received, the access operation ACC (e.g., the write operation) may be performed.

An example in which the nonvolatile memory device 100 consecutively performs the read operations is illustrated in FIG. 8. However, the nonvolatile memory device 100 may consecutively perform the write operations depending on commands and may perform a combination of the read operation and the write operation depending on commands.

Compared to the embodiment of FIG. 6, in the example embodiment of FIG. 8, discharging and precharging are skipped when the same row address is received. Accordingly, power consumption for discharging and precharging may be reduced.

Figure 9:
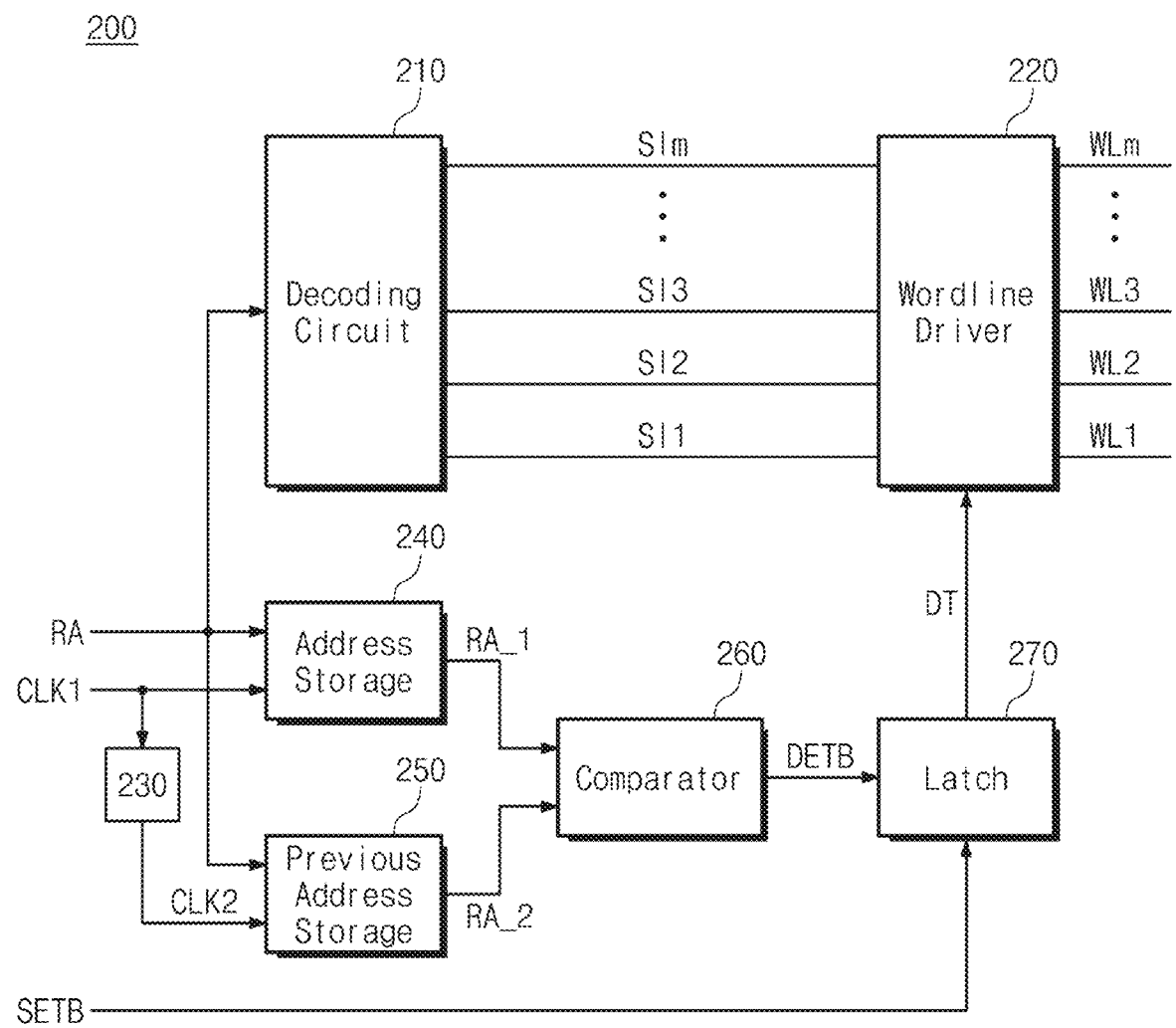
FIG. 9 illustrates an example of some of components of a row decoder.

FIG. 9 illustrates an example of some of components of the row decoder 120. A row decoder 200 may correspond to the row decoder 120 of FIG. 1. Referring to FIGS. 1 and 9, the row decoder 200 may include a decoding circuit 210, a wordline driver 220, a delay 230, address storage 240, previous address storage 250, a comparator 260, and a latch 270.

The decoding circuit 210, the wordline driver 220, the delay 230, the address storage 240, the previous address storage 250, the comparator 260, and the latch 270 may be implemented with hardware distinguished from each other. The decoding circuit 210, the wordline driver 220, the delay 230, the address storage 240, the previous address storage 250, the comparator 260, and the latch 270 may be called in combination with various terms such as a circuit, a block, and a unit.

The decoding circuit 210 may receive the row address RA from the control logic 160. The decoding circuit 210 may select one of first to m-th lines Sl1 to Slm based on the row address RA. For example, the decoding circuit 210 may control a signal of a line indicated by the row address RA from among the first to m-th lines Sl1 to Slm to be different from signals of the remaining lines (e.g., when the signal of the line indicated by the row address RA is set to a low level or a high level, the signals of the remaining lines may be set to the high level or the low level).

The wordline driver 220 may precharge or discharge one of the first to m-th wordlines WL1 to WLm in response to the signals of the first to m-th lines Sl1 to Slm and a detection signal DT transferred from the latch 270. For example, when one of the first to m-th lines Sl1 to Slm is activated by the decoding circuit 210 and the detection signal DT is in an inactive state, the wordline driver 220 may activate a wordline corresponding to the activated line from among the first to m-th wordlines WL1 to WLm.

When the detection signal DT is in an active state, the wordline driver 220 may discharge the first to m-th wordlines WL1 to WLm. For example, the wordline driver 220 may discharge a wordline being in a precharge state from among the first to m-th wordlines WL1 to WLm.

The delay 230, the address storage 240, the previous address storage 250, the comparator 260, and the latch 270 may correspond to the precharge determining circuit 125 of FIG. 1. The delay 230 may receive a first clock signal CLK1. The first clock signal CLK1 may be the clock signal CLK received by the control logic 160 of FIG. 1 or the internal clock signal generated by the control logic 160.

The delay 230 may delay the first clock signal CLK1 to output a second clock signal CLK2. For example, a delay time (or a delay amount) of the delay 230 may be smaller than a time length of one period of the first clock signal CLK1 (or the second clock signal CLK2) (or may be smaller than half the time length of one period thereof). The delay time of the delay 230 may be set to be equal to or greater than a minimum time in which the address storage 240, the previous address storage 250, the comparator 260, the latch 270, and the wordline driver 220 are capable of responding. That is, the delay time of the delay 230 may be set based on operation characteristics of the address storage 240, the previous address storage 250, the comparator 260, the latch 270, and the wordline driver 220.

The address storage 240 may receive the row address RA from the control logic 160. The address storage 240 may receive the first clock signal CLK1. The address storage 240 may output the row address RA as a first internal row address RA_1 in synchronization with the first clock signal CLK1. Because an output of the first internal row address RA_1 is maintained during one clock cycle of the first clock signal CLK1, the address storage 240 may be regarded as storing a row address.

For example, the row address RA may be transferred from the control logic 160 through row address input lines. The address storage 240 may output signals on the row address input lines as first internal row address signals (e.g., the first internal row address RA_1) in synchronization with the first clock signal CLK1.

The previous address storage 250 may receive the row address RA from the control logic 160. The previous address storage 250 may receive the second clock signal CLK2. The previous address storage 250 may output the row address RA as a second internal row address RA_2 in synchronization with the second clock signal CLK2. Because an output of the second internal row address RA_2 is maintained during one clock cycle of the second clock signal CLK2, the previous address storage 250 may be regarded as storing a row address.

For example, the row address RA may be transferred from the control logic 160 through the row address input lines. The previous address storage 250 may output signals on the row address input lines as second internal row address signals (e.g., the second internal row address RA_2) in synchronization with the second clock signal CLK2.

The first internal row address RA_1 may be maintained by the address storage 240 during one clock cycle of the first clock signal CLK1. The second internal row address RA_2 may be maintained by the previous address storage 250 during one clock cycle of the second clock signal CLK2. Due to a delay time between the first clock signal CLK1 and the second clock signal CLK2, a timing when the first internal row address RA_1 is a current row address RA and the second internal row address RA_2 is a previous row address may exist.

The comparator 260 may receive the first internal row address RA_1 from the address storage 240 and may receive the second internal row address RA_2 from the previous address storage 250. When the first internal row address RA_1 and the second internal row address RA_2 are the same, the comparator 260 may output an output signal DETB of a second level (e.g., the high level). When the first internal row address RA_1 and the second internal row address RA_2 are different, the comparator 260 may output the output signal DETB of a first level (e.g., the low level).

The latch 270 may receive a set signal SETB from the control logic 160 and may receive the output signal DETB of the comparator 260 as a reset signal. In response to that the set signal SETB transitions to the first level (e.g., the low level), the latch 270 may control the detection signal DT to the second level (or the high level). In response to that the output signal DETB transitions to the first level (e.g., the low level), the latch 270 may control the detection signal DT to the first level (or the low level).

For example, the set signal SETB may be controlled to be complementary to the output signal DETB. The set signal SETB may be generated from the output signal DETB instead of being received from the control logic 160.

When the first internal row address RA_1 and the second internal row address RA_2 are different, the comparator 260 may output the output signal DETB of the first level (e.g., the low level), and the latch 270 may control the detection signal DT to the first level (e.g., the low level).

When the first internal row address RA_1 and the second internal row address RA_2 are the same, the comparator 260 may output the output signal DETB of the second level (e.g., the high level), and the latch 270 may control the detection signal DT to the second level (e.g., the high level).

Figure 10:
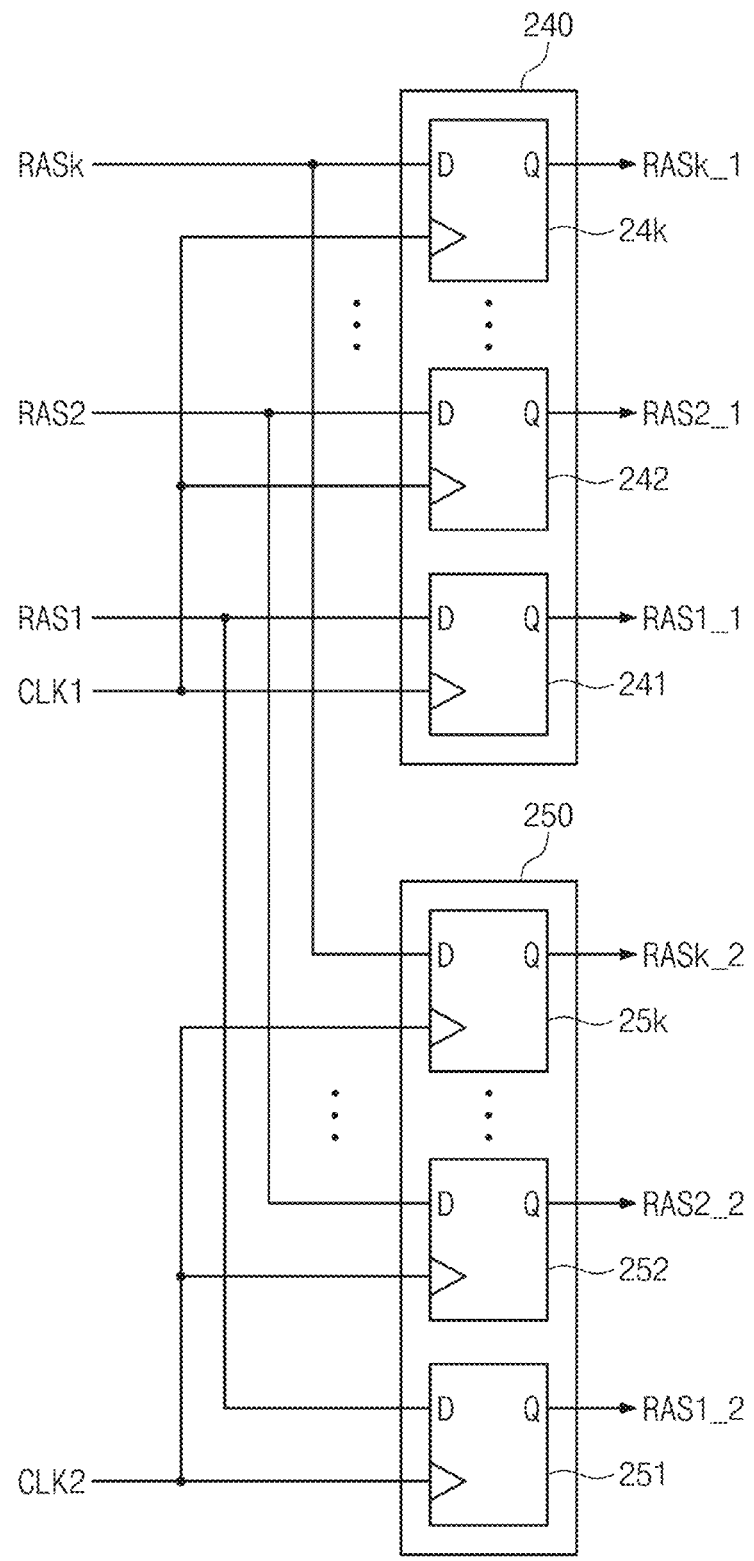
FIG. 10 illustrates an example of address storage and previous address storage.

FIG. 10 illustrates an example of the address storage 240 and the previous address storage 250. Referring to FIGS. 1, 9, and 10, the address storage 240 may include first to k-th flip-flops 241 to 24k. The first to k-th flip-flops 241 to 24k may receive first to k-th row address signals RAS1 to RASk of the row address RA, respectively. The first to k-th flip-flops 241 to 24k may output the first to k-th row address signals RAS1 to RASk of the row address RA as first to k-th internal row address signals RAS1_1 to RASk_1 of the first internal row address RA_1 in synchronization with the first clock signal CLK1.

The previous address storage 250 may include first to k-th flip-flops 251 to 25k. The first to k-th flip-flops 251 to 25k may receive the first to k-th row address signals RAS1 to RASk of the row address RA, respectively. The first to k-th flip-flops 251 to 25k may output the first to k-th row address signals RAS1 to RASk of the row address RA as first to k-th internal row address signals RAS1_2 to RASk_2 of the second internal row address RA_2 in synchronization with the second clock signal CLK2.

Figure 11:
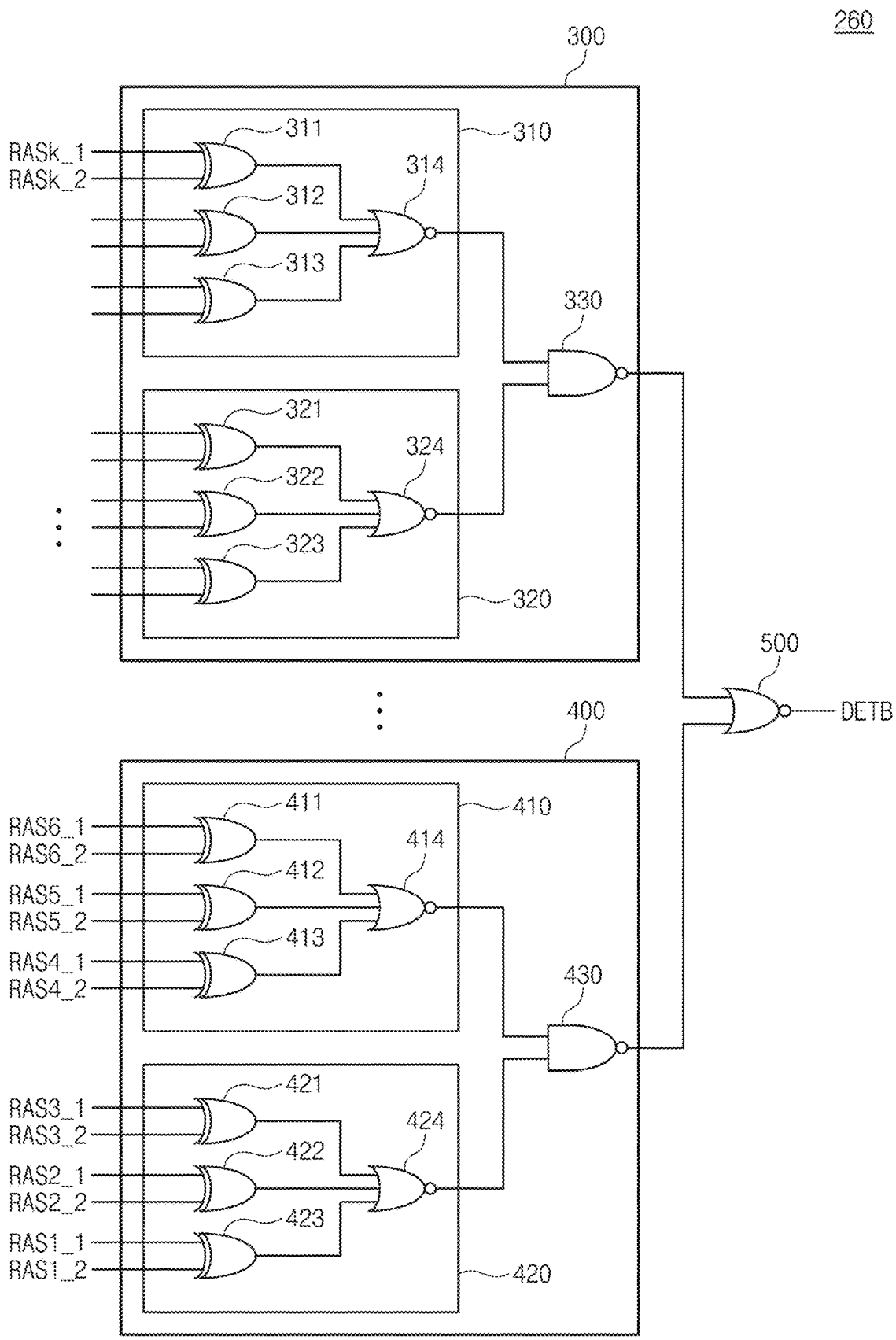
FIG. 11 illustrates a comparator according to an example embodiment of the present disclosure.

FIG. 11 illustrates the comparator 260 according to an example embodiment of the present disclosure. Referring to FIGS. 1, 9, 10, and 11, the comparator 260 may include a first partial circuit 300, a second partial circuit 400, and a detection circuit 500.

The first partial circuit 300 may receive first group signals of the first to k-th internal row address signals RAS1_1 to RASk_1 of the first internal row address RA_1 and may receive second group signals of the first to k-th internal row address signals RAS1_2 to RASk_2 of the second internal row address RA_2. For example, the first group signals and the second group signals may correspond to row address signals received through the same row address signal lines.

The first partial circuit 300 may output a signal of the first level (e.g., the low level) when levels of the first group signals and levels of the second group signals are the same. The first partial circuit 300 may output the signal of the second level (e.g., the high level) when levels of the first group signals and levels of the second group signals are different.

The first partial circuit 300 may include a first unit circuit 310, a second unit circuit 320, and a detection circuit 330. The first unit circuit 310 may include exclusive OR circuits 311 to 313, and the second unit circuit 320 may include exclusive OR circuits 321 to 323. The exclusive OR circuits 311 to 313 or 321 to 323 may receive first internal row address signals being different and second internal row address signals being different. Each of the exclusive OR circuits 311 to 313 or 321 to 323 may receive a first internal row address signal and a second internal row address signal corresponding to the same address signal line.

A unit detection circuit 314 or 324 may determine whether internal row address signals received by the exclusive OR circuits 311 to 313 or 321 to 323 are the same or different.

For example, when some of the first internal row address signals and some of the second internal row address signals received by the exclusive OR circuits 311 to 313 or 321 to 323 are the same, the unit detection circuit 314 or 324 may output a signal of the second level (e.g., the high level).

When some of the first internal row address signals and some of the second internal row address signals received by the exclusive OR circuits 311 to 313 or 321 to 323 are different, the unit detection circuit 314 or 324 may output the signal of the first level (e.g., the low level).

The unit detection circuit 314 or 324 of the first partial circuit 300 may include a NOR gate. The detection circuit 330 of the first partial circuit 300 may include a NAND gate. The detection circuit 330 of the first partial circuit 300 may output a signal of the second level (e.g., the high level) when the first group signals and the second group signals are different. The detection circuit 330 of the first partial circuit 300 may output the signal of the first level (e.g., the low level) when the first group signals and the second group signals are the same.

The second partial circuit 400 may receive third group signals of the first to k-th internal row address signals RAS1_1 to RASk_1 of the first internal row address RA_1 and may receive fourth group signals of the first to k-th internal row address signals RAS1_2 to RASk_2 of the second internal row address RA_2. For example, the third group signals and the fourth group signals may correspond to row address signals received through the same row address signal lines.

The second partial circuit 400 may output a signal of the first level (e.g., the low level) when levels of the third group signals and levels of the fourth group signals are the same. The second partial circuit 400 may output the signal of the second level (e.g., the high level) when levels of the third group signals and levels of the fourth group signals are different.

The second partial circuit 400 may include a third unit circuit 410, a fourth unit circuit 420, and a detection circuit 430. The third unit circuit 410 may include exclusive OR circuits 411 to 413, and the fourth unit circuit 420 may include exclusive OR circuits 421 to 423. The exclusive OR circuits 411 to 413 or 421 to 423 may receive first internal row address signals being different and second internal row address signals being different. Each of the exclusive OR circuits 411 to 413 or 421 to 423 may receive a first internal row address signal and a second internal row address signal corresponding to the same address signal line.

A unit detection circuit 414 or 424 may determine whether internal row address signals received by the exclusive OR circuits 411 to 413 or 421 to 423 are the same or different.

For example, when some of the first internal row address signals and some of the second internal row address signals received by the exclusive OR circuits 411 to 413 or 421 to 423 are the same, the unit detection circuit 414 or 424 may output a signal of the second level (e.g., the high level).

When some of the first internal row address signals and some of the second internal row address signals received by the exclusive OR circuits 411 to 413 or 421 to 423 are different, the unit detection circuit 414 or 424 may output the signal of the first level (e.g., the low level).

The unit detection circuit 414 or 424 of the second partial circuit 400 may include a NOR gate. The detection circuit 430 of the second partial circuit 400 may include a NAND gate. The detection circuit 430 of the second partial circuit 400 may output a signal of the second level (e.g., the high level) when the third group signals and the fourth group signals are different. The detection circuit 430 of the second partial circuit 400 may output the signal of the first level (e.g., the low level) when the third group signals and the fourth group signals are the same.

The detection circuit 500 may receive an output signal of the first partial circuit 300 and an output signal of the second partial circuit 400. The detection circuit 500 may include a NOR gate. When the first internal row address signals RA1_1 to RAk_1 and the second internal row address signals RA1_2 to RAk_2 are different, the detection circuit 500 may output a signal of the first level (e.g., the low level). When the first internal row address signals RA1_1 to RAk_1 and the second internal row address signals RA1_2 to RAk_2 are the same, the detection circuit 500 may output the signal of the second level (e.g., the high level).

Figure 12:
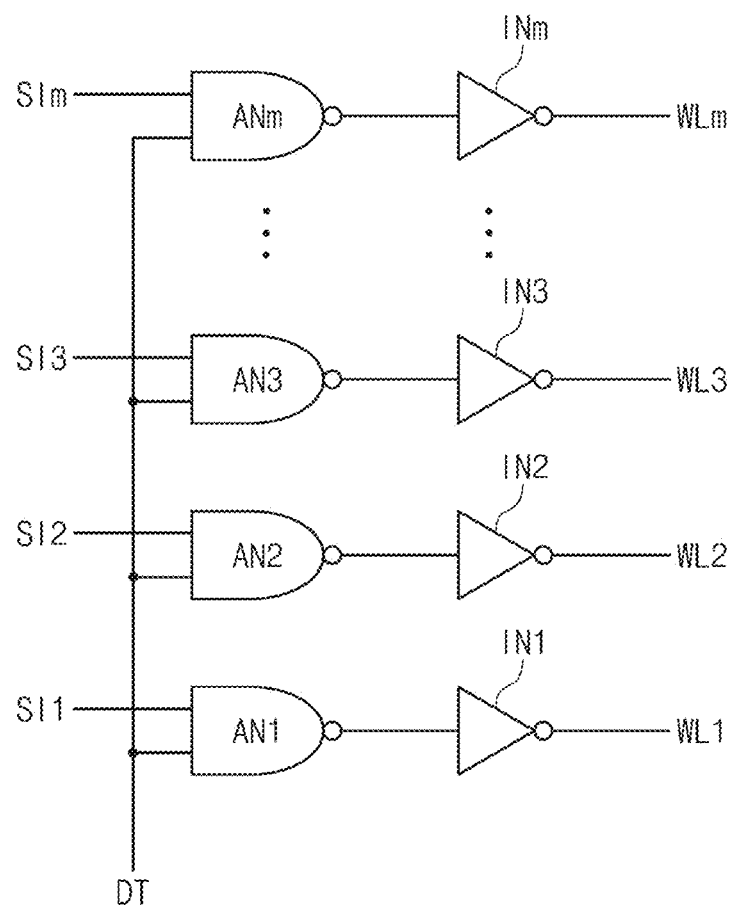
FIG. 12 illustrates an implementation example of a wordline driver.

FIG. 12 illustrates an implementation example of the wordline driver 220. Referring to FIGS. 1, 11, and 12, the wordline driver 220 may include first to m-th NAND gates AN1 to ANm receiving signals on the first to m-th lines Sl1 to Slm, respectively, and the detection signal DT, and first to m-th inverters IN1 to INm receiving outputs of the first to m-th NAND gates AN1 to ANm.

The first to m-th inverters IN1 to INm may precharge a corresponding wordline of the first to m-th wordlines WL1 to WLm in response to a signal of the first level (e.g., the low level) is output from the first to m-th NAND gates AN1 to ANm (e.g., may precharge the wordline with a power supply voltage).

The first to m-th inverters IN1 to INm may discharge a corresponding wordline of the first to m-th wordlines WL1 to WLm (e.g., may discharge the corresponding wordline to a ground voltage), in response to a signal of the second level (e.g., the high level) is output from the first to m-th NAND gates AN1 to ANm.

The first to m-th NAND gates AN1 to ANm may output a signal of the first level (e.g., the low level) in response to that a signal of a corresponding line of the first to m-th lines Sl1 to Slm is at the second level (e.g., the high level) and the detection signal DT is at the second level (e.g., the high level).

Figure 13:
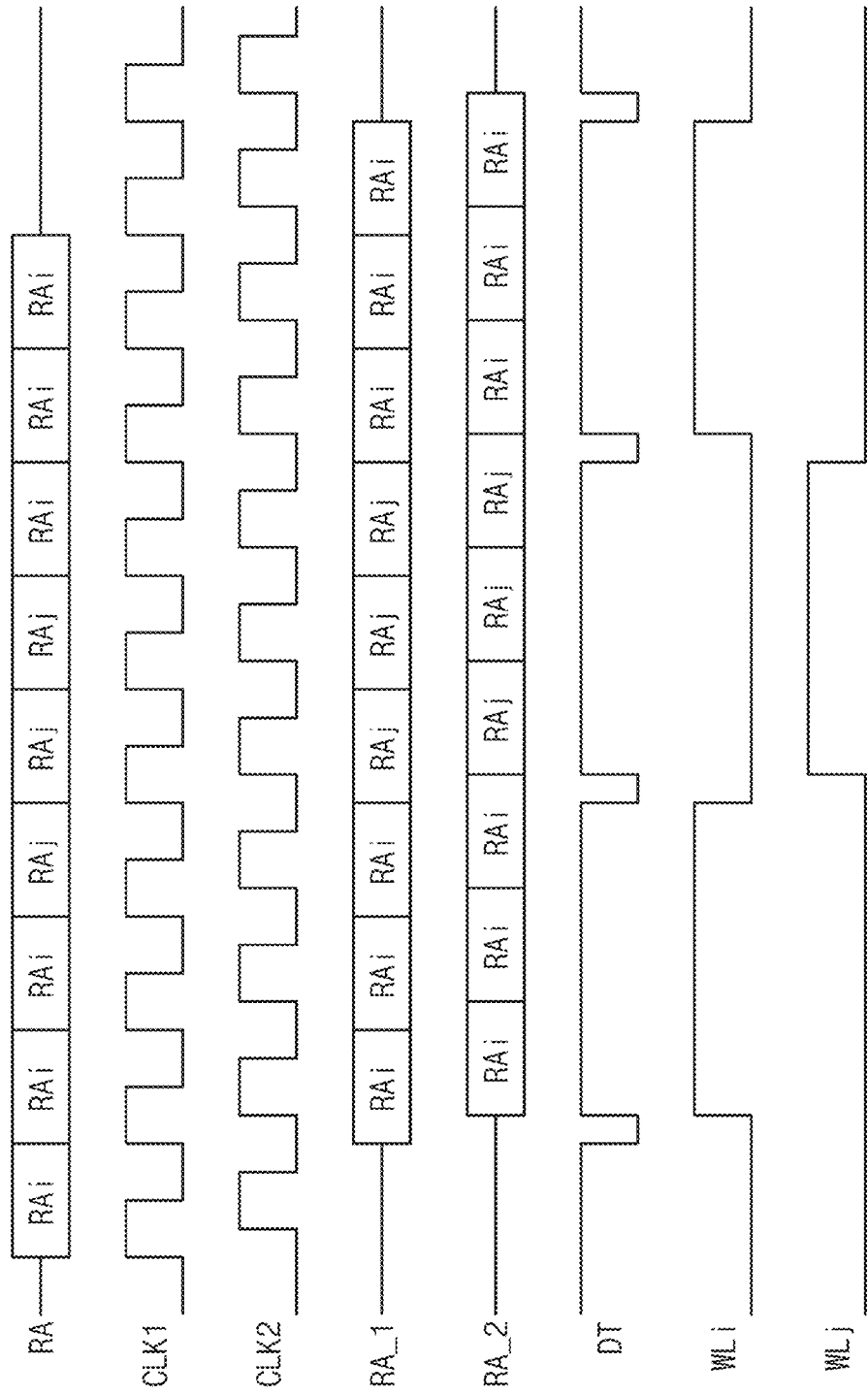
FIG. 13 illustrates an example in which a row decoder adjusts voltages of wordlines.

FIG. 13 illustrates an example in which the row decoder 120 adjusts voltages of the wordlines WL1 to WLm. Referring to FIGS. 1, 9, 10, 11, 12, and 13, the nonvolatile memory device 100 may receive an i-th row address RAi in synchronization with the first clock signal CLK1.

The address storage 240 may output the i-th row address RAi as a first internal row address RA_1 in synchronization with the first clock signal CLK1. The previous address storage 250 may output the i-th row address RAi as a second internal row address RA_2 in synchronization with the second clock signal CLK2.

In response to the address storage 240 outputting the i-th row address RAi, the comparator 260 may compare the i-th row address RAi with a previous row address. For example, the previous row address may be an initial value. For example, an access to the i-th row address RAi may be an access that is first made after the power-on of the nonvolatile memory device 100.

The previous address storage 250 may output the initial value as the second internal row address RA_2. The address storage 240 may output the i-th row address RAi as the first internal row address RA_1. Because a received row address (e.g., the first internal row address RA_1) and a previous row address (e.g., the second internal row address RA_2) are different, in response to the first internal row address RA_1 being outputted, the detection signal DT may output a signal of the first level (e.g., the low level).

In response to that the detection signal DT transitions to the first level (e.g., the low level), the first to m-th wordlines WL1 to WLm may be discharged. After the delay time of the delay 230, the previous address storage 250 may output the i-th row address RAi as the second internal row address RA_2. In response to the first internal row address RA_1 and the second internal row address RA_2 being the same, the detection signal DT may output the second level (e.g., the high level).

When the i-th row address RAi is received, the decoding circuit 210 may set (or activate) the i-th line Sli of the first to m-th lines Sl1 to Slm to the second level (e.g., the high level). In response to the detection signal DT transitioning to the second level (e.g., the high level), the wordline driver 220 may precharge the i-th wordline WLi of the first to m-th wordlines WL1 to WLm.

Afterwards, the i-th row address RAi may be further received for a second time. In response to receiving the same i-th row address RAi, the first internal row address RA_1 and the second internal row address RA_2 may be the i-th row address RAi. Accordingly, the decoding circuit 210 may maintain the selection of the i-th line Sli of the first to m-th lines Sl1 to Slm at the second level, and the detection signal DT may maintain the high level. That is, the precharge state of the selected i-th wordline WLi may be maintained.

Afterwards, in response to receiving a j-th row address RAj, the address storage 240 may output the j-th row address RAj as the first internal row address RA_1. Because the previous address storage 250 outputs the i-th row address RAi, the detection signal DT may output the signal of the first level (e.g., the low level). That is, the i-th wordline WLi may be discharged.

After the delay time of the delay 230, the previous address storage 250 may output the j-th row address RAj as the second internal row address RA_2. In response to the first internal row address RA_1 and the second internal row address RA_2 being the same, the detection signal DT may output the second level (e.g., the high level).

When the j-th row address RAj is received, the decoding circuit 210 may set (or activate) the j-th line Slj of the first to m-th lines Sl1 to Slm to the second level (e.g., the high level). In response to that the detection signal DT transitions to the second level (e.g., the high level), the wordline driver 220 may precharge the j-th wordline WLj of the first to m-th wordlines WL1 to WLm.

Afterwards, the j-th row address RAj may be further received twice. In response to that the same j-th row address RAj is received, the first internal row address RA_1 and the second internal row address RA_2 may be the j-th row address RAj. Accordingly, the decoding circuit 210 may maintain the selection of the j-th line Slj of the first to m-th lines Sl1 to Slm at the second level, and the detection signal DT may maintain the high level. That is, the precharge state of the selected j-th wordline WLj may be maintained.

Afterwards, the i-th row address RAi different from the j-th row address RAj or any other row address may be received. When any other row address is received, the row decoder 120 may perform discharging and precharging. When the same row address is received, the row decoder 120 may maintain a precharge state of a wordline.

As described above, while the same row address is received, the nonvolatile memory device 100 may maintain a precharge state of a selected wordline. In response to that any other row address is received, the nonvolatile memory device 100 may perform the discharging of a previously selected wordline and the precharging of a newly selected wordline.

The address storage 240 may store the row address RA during a first time interval, and the previous address storage 250 may store the row address RA during a second time interval. Due to the delay time of the delay 230, at a time when the address storage 240 stores the row address RA in synchronization with the first clock signal CLK1, the previous address storage 250 may store a previous row address. That is, at a time when the row address RA is received, the row address RA and the previous row address may be compared.

By performing comparison at a time when the row address RA is received and performing precharging after the delay time of the delay 230, the nonvolatile memory device 100 may perform the following operations in synchronization with the first clock signal CLK1: receiving the row address RA every clock cycle of the first clock signal CLK1, comparing the received row address RA and a previous row address, selectively performing discharging and precharging, and accessing the nonvolatile memory cells MC. Accordingly, the access to the nonvolatile memory cells MC may be prevented from being delayed due to the comparison of the row address RA with the previous row address and the determination of whether to perform discharging and precharging. In other words, the access to the nonvolatile memory cells MC may be prevented from being delayed due to discharging and precharging of corresponding memory cells based on output based on the row address RA with the previous row address (e.g., based on a comparison of the row address RA with the previous row address). Accordingly, an operating speed of the nonvolatile memory device 100 may be improved.

Figure 14:
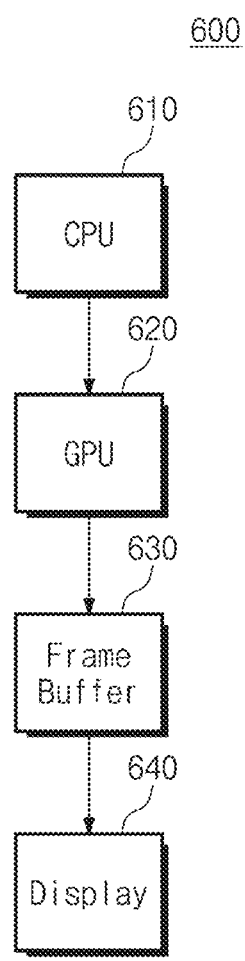
FIG. 14 illustrates an electronic device according to a first example embodiment of the present disclosure.

FIG. 14 illustrates an electronic device 600 according to a first example embodiment of the present disclosure. Referring to FIG. 14, the electronic device 600 may include a central processing unit (CPU) 610, a graphic processing device (GPU) 620, a frame buffer 630, and a display 640.

The central processing unit 610 may generate information of an image to be displayed through the display 640. The central processing unit 610 may request the graphic processing device 620 to generate image data to be displayed through the display 640, based on the information of the image.

The graphic processing device 620 may generate image data, based on the image information received from the central processing unit 610. For example, the graphic processing device 620 may generate image data in units of frame. The graphic processing device 620 may store each frame of the image data in the frame buffer 630. The display 640 may display the frame of the image data stored in the frame buffer 630.

For example, the frame buffer 630 may include the nonvolatile memory device 100 described with reference to FIGS. 1 to 13. The frame of the image data may accompany operations of consecutively writing and reading data of one row. As described with reference to FIGS. 1 to 13, as the frame buffer 630 skips discharging and precharging when accessing nonvolatile memory cells of the same row, power consumption of the frame buffer 630 and the electronic device 600 may be reduced.

Figure 15:
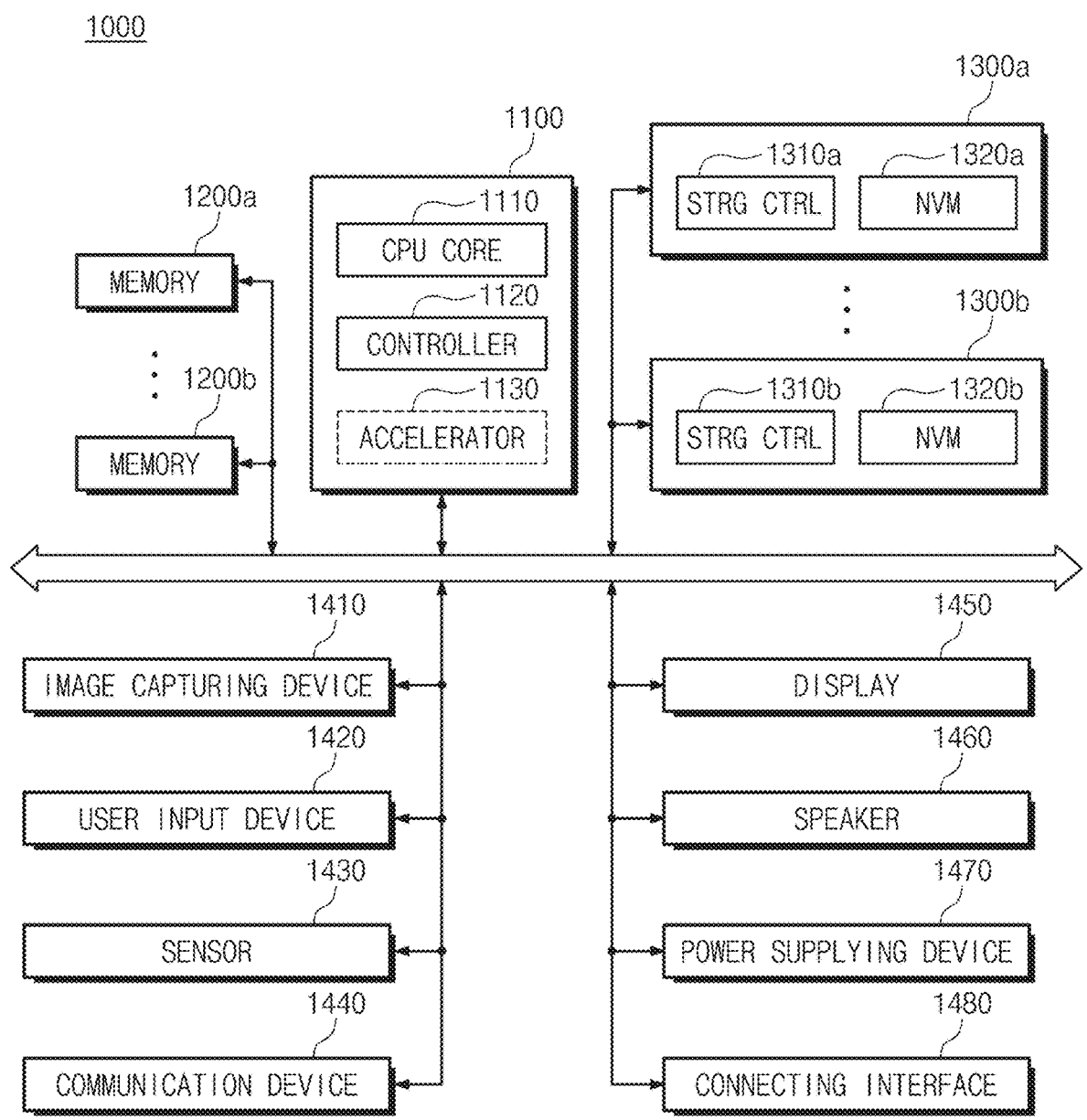
FIG. 15 is a diagram illustrating a system to which a nonvolatile memory device according to an example embodiment of the present disclosure is applied.

FIG. 15 is a diagram of a system 1000 to which a storage device is applied, according to an example embodiment. The system 1000 of FIG. 15 may be a mobile system, such as a portable communication terminal (e.g., a mobile phone), a smartphone, a tablet personal computer (PC), a wearable device, a healthcare device, or an Internet of things (JOT) device. However, the system 1000 of FIG. 15 is not necessarily limited to the mobile system and may be a PC, a laptop computer, a server, a media player, or an automotive device (e.g., a navigation device).

Referring to FIG. 15, the system 1000 may include a main processor 1100, memories (e.g., 1200a and 1200b), and storage devices (e.g., 1300a and 1300b). Further, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and NVMs (Non-Volatile Memory) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a nonvolatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

The nonvolatile memory 1320a or 1320b or the memory 1200a or 1200b of the storage device 1300a or 1300b may be implemented with the nonvolatile memory device 100 described with reference to FIGS. 1 to 13.

In the above example embodiments, components according to the present disclosure are described by using the terms "first", "second", "third", and the like. However, the terms "first", "second", "third", and the like may be used to distinguish components from each other and do not limit the present disclosure. For example, the terms "first", "second", "third", and the like do not involve an order or a numerical meaning of any form.

In the above example embodiments, components are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to some example embodiments of the present disclosure, a nonvolatile memory device may compare a row address with a previous row address every clock cycle and may selectively perform discharging and precharging of a wordline depending on a comparison result. In other words, according to some example embodiments of the present disclosure, a nonvolatile memory device may receive a row address with a previous row address every clock cycle and may selectively perform discharging and precharging of a wordline based on the (current) receive row address and previous row address. Accordingly, a nonvolatile memory device with an improved operating speed and/or reduced power consumption, an operating method of the nonvolatile memory device, and an electronic device including the nonvolatile memory device are provided.

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
    a memory cell array including a plurality of nonvolatile memory cells; and
    a row decoder connected with the memory cell array through wordlines, wherein the row decoder is configured to,
        precharge a first wordline corresponding to a first row address from among the wordlines in response to receiving the first row address together with a first command, and
        maintain a precharge state of the first wordline in response to receiving a second row address identical to the first row address together with a second command following the first command, and
    wherein the row decoder includes,
        a first circuit configured to output row address signals, which are input to the first circuit through row address input lines and correspond to the first row address or the second row address, as first internal address signals,
        a second circuit configured to delay the row address signals transferred through the row address input lines to output second internal address signals, and
        a third circuit configured to output an output signal based on the first internal address signal and the second internal address signals.

2. The nonvolatile memory device of claim 1, wherein the row decoder is configured to discharge the first wordline and precharge a second wordline corresponding to a third row address from among the wordlines, in response to receiving the third row address different from the first row address together with the second command.

3. The nonvolatile memory device of claim 1, wherein the row decoder further includes:
    a latch configured to receive the output signal of the third circuit,
    wherein the latch is configured to
    reset in response to the output signal indicating that the first internal address signals and the second internal address signals are different, and
    set in response to the output signal indicating that the first internal address signals and the second internal address signals are identical.

4. The nonvolatile memory device of claim 3, wherein the row decoder further includes:
    a wordline driver configured to discharge a precharged wordline in response to the latch being set.

5. The nonvolatile memory device of claim 1, wherein the row decoder further includes a delay configured to delay a first clock signal to output a second clock signal, the first circuit is configured to output the row address signals as the first internal address signals in synchronization with the first clock signal, and the second circuit is configured to output the row address signals as the second internal address signals in synchronization with the second clock signal.

6. The nonvolatile memory device of claim 5, wherein a delay time of the delay is shorter than a time of one period of the first clock signal.

7. The nonvolatile memory device of claim 5, wherein the first circuit includes flip-flops that are configured to output the row address signals, respectively, as the first internal address signals in synchronization with the first clock signal.

8. The nonvolatile memory device of claim 5, wherein the second circuit includes flip-flops that are configured to output the row address signals, respectively, as the second internal address signals in synchronization with the second clock signal.

9. The nonvolatile memory device claim 1, wherein the third circuit includes,
a first partial circuit configured to,
receive first group signals of the first internal address signals,
receive second group signals of the second internal address signals,
output a signal of a first level when levels of the first group signals and levels of the second group signals are identical, and
output a signal of a second level when the levels of the first group signals and the levels of the second group signals are different,
a second partial circuit configured to,
receive third group signals of the first internal address signals,
receive fourth group signals of the second internal address signals,
output a signal of the first level when levels of the third group signals and levels of the fourth group signals are identical, and
output a signal of the second level when the levels of the third group signals and the levels of the fourth group signals are different, and
the precharge state of the first wordline is maintained in response to each of the first partial circuit and the second partial circuit outputting the first level.

10. The nonvolatile memory device of claim 9, wherein the first partial circuit includes,
a plurality of XOR gates, and
a NOR gate configured to receive outputs of the XOR gates and perform a NOR operation thereon, and
each of the plurality of XOR gates is configured to receive a corresponding one of the first group signals and a corresponding one of the second group signals.

11. An operating method of a nonvolatile memory device, the method comprising:
receiving, at the nonvolatile memory device, a command and a row address;
discharging a previous wordline corresponding to a previous row address and precharging a wordline corresponding to the row address, in response to the row address being different from the previous row address;
maintaining a precharge state of the previous wordline in response to the row address being identical to the previous row address;
storing the previous row address during a first time interval;

storing the previous row address during a second time interval;

storing the row address during a third time interval; and
generating an output signal based on the previous row address and the row address during a fourth time interval, during which the second time interval, and the third time interval overlap each other.

12. The method of claim 11, wherein
the storing the previous row address during the first time interval and the storing the row address during the third time interval are performed in response to a first clock signal, and
the storing the previous row address during the second time interval is performed in response to a second clock signal.

13. The method of claim 12, wherein the second clock signal is of a delayed form of the first clock signal.

14. The method of claim 13, wherein a delay time by which the second clock signal is delayed with respect to the first clock signal is shorter than a period of the first clock signal.

15. The method of claim 13, wherein a delay time by which the second clock signal is delayed with respect to the first clock signal is shorter than half a period of the first clock signal.

16. An electronic device comprising:
a central processing unit configured to generate image information;
a graphic processing device configured to generate image data based on the image information received from the central processing unit;
a frame buffer configured to store the image data received from the graphic processing device; and
a display device configured to display the image data received from the frame buffer,
wherein the frame buffer includes a nonvolatile memory device, the nonvolatile memory device including,
a memory cell array including a plurality of nonvolatile memory cells, and
a row decoder connected with the memory cell array through wordlines,
wherein the row decoder is configured to discharge a previous wordline corresponding to a previous row address and precharge a wordline corresponding to a row address, in response to the row address received from the graphic processing device being different from the previous row address previously received from the graphic processing device,
wherein the row decoder is configured to maintain a precharge state of the previous wordline in response to the row address being identical to the previous row address,
wherein the nonvolatile memory device further includes,
a first circuit configured to store the row address in response to a first clock signal,
a second circuit configured to store the row address in response to a second clock signal, and
a third circuit configured to output an output signal based on an output of the first circuit and an output of the second circuit, and
wherein the second clock signal is delayed with respect to the first clock signal.

17. The electronic device of claim 16, wherein the nonvolatile memory device is implemented with one of a phase-change memory device, a ferroelectric memory device, a magnetic memory device, or a resistive memory device.

\* \* \* \* \*